United States Patent
Wheeler et al.

(10) Patent No.: US 6,643,836 B2
(45) Date of Patent: Nov. 4, 2003

(54) DISPLAYING INFORMATION RELATING TO A LOGIC DESIGN

(75) Inventors: William R. Wheeler, Southborough, MA (US); Matthew J. Adiletta, Worcester, MA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/941,923

(22) Filed: Aug. 29, 2001

(65) Prior Publication Data

US 2003/0046648 A1 Mar. 6, 2003

(51) Int. Cl.[7] .............................................. G06F 17/50
(52) U.S. Cl. .................................. 716/11; 716/3; 716/4; 716/18; 703/16
(58) Field of Search ........................... 716/3, 4, 11, 18; 703/14–16

(56) References Cited

U.S. PATENT DOCUMENTS

| | | | | |
|---|---|---|---|---|
| 5,128,871 A | * | 7/1992 | Schmitz | 716/17 |
| 5,220,512 A | * | 6/1993 | Watkins et al. | 716/11 |
| 5,258,919 A | * | 11/1993 | Yamanouchi et al. | 716/11 |
| 5,506,788 A | * | 4/1996 | Cheng et al. | 716/10 |
| 5,513,119 A | | 4/1996 | Moore et al. | 716/8 |
| 5,553,002 A | * | 9/1996 | Dangelo et al. | 716/11 |
| 5,629,857 A | | 5/1997 | Brennan | 716/11 |
| 5,666,289 A | | 9/1997 | Watkins | 716/8 |
| 5,828,581 A | | 10/1998 | Matumura | 716/12 |
| 5,852,564 A | * | 12/1998 | King et al. | 703/14 |
| 5,889,677 A | * | 3/1999 | Yasuda et al. | 716/6 |
| 5,892,678 A | | 4/1999 | Tokunoh et al. | 716/2 |
| 5,933,356 A | * | 8/1999 | Rostoker et al. | 703/15 |
| 5,963,724 A | * | 10/1999 | Mantooth et al. | 703/14 |
| 6,044,211 A | * | 3/2000 | Jain | 716/18 |
| 6,053,947 A | | 4/2000 | Parson | 703/14 |
| 6,066,179 A | | 5/2000 | Allan | 716/4 |
| 6,106,568 A | * | 8/2000 | Beausang et al. | 716/18 |
| 6,117,183 A | * | 9/2000 | Teranishi et al. | 716/11 |
| 6,120,549 A | | 9/2000 | Goslin et al. | 703/20 |
| 6,132,109 A | * | 10/2000 | Gregory et al. | 717/131 |
| 6,135,647 A | | 10/2000 | Balakrishnan et al. | 716/18 |
| 6,152,612 A | | 11/2000 | Liao et al. | 703/23 |
| 6,205,573 B1 | * | 3/2001 | Hasegawa | 716/11 |
| 6,219,822 B1 | * | 4/2001 | Gristede et al. | 716/10 |
| 6,233,723 B1 | | 5/2001 | Pribetich | 716/17 |
| 6,236,956 B1 | * | 5/2001 | Mantooth et al. | 703/14 |
| 6,260,179 B1 | * | 7/2001 | Ohsawa et al. | 716/5 |
| 6,272,671 B1 | * | 8/2001 | Fakhry | 716/18 |
| 6,298,468 B1 | * | 10/2001 | Zhen | 716/2 |
| 6,311,309 B1 | | 10/2001 | Southgate | 716/1 |
| 6,324,678 B1 | * | 11/2001 | Dangelo et al. | 716/18 |
| 6,366,874 B1 | * | 4/2002 | Lee et al. | 703/14 |
| 6,378,115 B1 | * | 4/2002 | Sakurai | 716/7 |
| 6,401,230 B1 | * | 6/2002 | Ahanessians et al. | 716/1 |
| 6,449,762 B1 | * | 9/2002 | McElvain | 716/18 |

(List continued on next page.)

OTHER PUBLICATIONS

Foley et al., "An Object Based Graphical User Interface for Power Systems", IEEE Transactions on Power Systems, vol. 8, No. 1, Feb. 1993, pp. 97–101.*

(List continued on next page.)

Primary Examiner—Matthew Smith
Assistant Examiner—Phallaka Kik
(74) Attorney, Agent, or Firm—Fish & Richardson P.C.

(57) ABSTRACT

Displaying information relating to a logic design includes generating a first display that relates to the logic design, the first display being associated with other information not included in the first display, retrieving the other information in response to a user input, and generating a second display that relates to the logic design based on the other information.

30 Claims, 11 Drawing Sheets

U.S. PATENT DOCUMENTS

| | | | |
|---|---|---|---|
| 6,457,164 B1 | * | 9/2002 | Hwang et al. ................. 716/8 |
| 6,477,683 B1 | * | 11/2002 | Killian et al. .................. 716/1 |
| 6,477,689 B1 | | 11/2002 | Mandell et al. ............... 716/11 |
| 6,480,985 B1 | | 11/2002 | Reynolds et al. .............. 716/1 |
| 6,487,698 B1 | | 11/2002 | Andreev et al. ............... 716/3 |
| 6,505,341 B1 | * | 1/2003 | Harris et al. ................ 717/100 |
| 6,519,755 B1 | | 2/2003 | Anderson .................... 716/18 |
| 2001/0018758 A1 | | 8/2001 | Tanaka et al. ................. 716/6 |
| 2002/0023256 A1 | | 2/2002 | Seawright .................... 716/18 |
| 2002/0042904 A1 | * | 4/2002 | Ito et al. ........................ 716/8 |
| 2002/0046386 A1 | | 4/2002 | Skoll et al. .................... 716/1 |
| 2002/0049957 A1 | | 4/2002 | Hosono et al. ................ 716/5 |
| 2002/0166100 A1 | | 11/2002 | Meding ......................... 716/5 |
| 2003/0005396 A1 | * | 1/2003 | Chen et al. .................... 716/5 |
| 2003/0016206 A1 | | 1/2003 | Taitel .......................... 345/103 |
| 2003/0016246 A1 | | 1/2003 | Singh .......................... 345/763 |

OTHER PUBLICATIONS

Pedram et al., "Floorplanning with pin assignment", 1990 IEEE International Conference on Computer–Aided Design, 11, Nov. 1990, pp. 98–101.*

Foley et al., "An Object Based Graphical User Interface for Power Systems", IEEE Transactions on Power Systems, vol. 8, No. 1, Feb. 1993, pp. 97–104.

Pedram et al., "Floorplanning with Pin assignment", 1990 IEEE International Conference on Computer–Aided Design, Nov. 11, 1990, pp. 98–101.

Renoir, HDL Design Datasheet, Mentor Graphics, 1–8, 1999.

Mentor Graphics Corporation Renoir™ With HDL2Graphics™, pp. 1–6, 1998, Oregon.

Mentor Graphics Corporation, Renoir HDL Design Datasheet, pp. 1–2, 1999, Oregon.

Computer Design, "After Hard Knocks, Cycle–Based Simulators Stand Their Ground". http://www.computer–design.com/Editorial/1996/10/ASIC/after.html, accessed on Aug. 23, 2001, pp. 1–5.

* cited by examiner

DISPLAYING INFORMATION RELATING TO A LOGIC DESIGN

TECHNICAL FIELD

This invention relates to displaying information relating to a logic design.

BACKGROUND

Logic designs for computer chips typically include combinatorial elements and state elements. Combinatorial elements, such as AND gates and OR gates, combine two or more logic states to produce an output. State elements, such as latches and flip-flops (FFs), hold a logic state for a period of time, usually until receipt of an external clock signal.

Logic designers typically represent logic elements, such as those noted above, using block diagrams. Computer-aided design (CAD) systems may be used to generate such block diagrams electronically. Conventional CAD systems, however, do not provide the flexibility and types/extent of information desired by many logic designers.

DESCRIPTION

Figure 1:
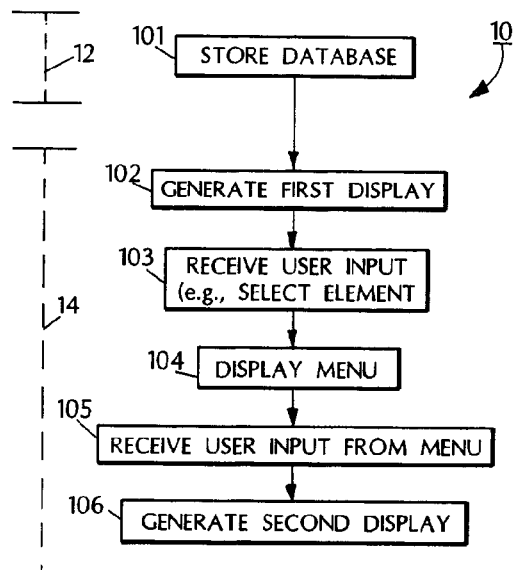
FIG. 1 is a flowchart showing a process for displaying information relating to a logic design.

Referring to FIG. 1, a process 10 is shown for displaying information relating to a logic design. Process 10 may be implemented as CAD software running on a computer or other programmable machine, as described below.

Process 10 may be divided into two stages: a pre-processing stage 12 and a run-time stage 14. In pre-processing stage 12, process 10 stores (101) a database of information that relates to a logic design. The information may be input manually by a logic designer and/or may be generated electronically by a computer program. Examples of the information include, but are not limited to, a block diagram of the logic design, the relative physical placement of elements of the logic design on a computer chip, simulation code that may be executed to simulate one or more elements of the logic design, intermediate code (defined below) from which the simulation code may be generated automatically, logic which is based on the simulation code, circuit element pin assignments in the logic design (i.e., element interface information), and/or text that describes the logic design and/or elements thereof.

The database is organized by type of display. In more detail, process 10 is capable of generating and displaying several different types of displays for a single logic design. The displays provide different information and/or levels of detail for the design. Interactive menus allow a user to navigate through the various types of display.

In this embodiment, four different types of displays may be generated. The four types of displays include a register transfer diagram (RTD) display, a combination box display, an interface display, and a documentation display. The database stores information for each type of display. The information in each type of display is associated, in the database, with that display. Accordingly, when a particular display is generated, the relevant information for that display is retrieved from the database and presented.

Figure 2:
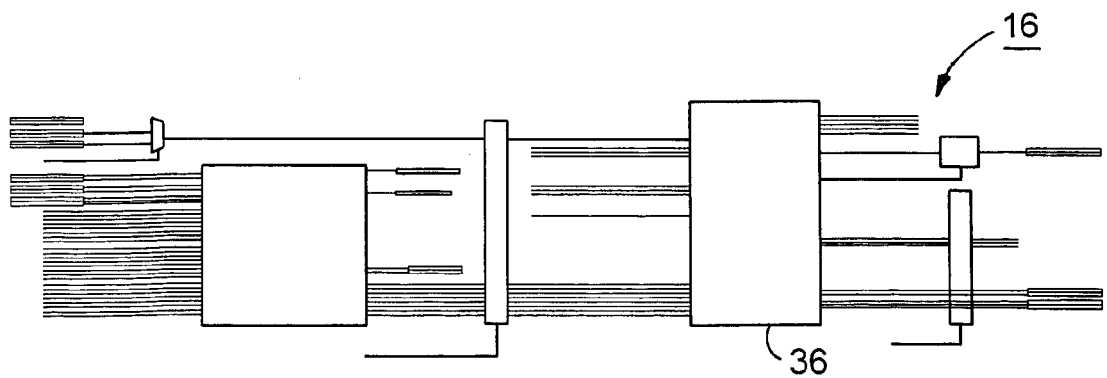
FIG. 2 is a block diagram of a register transfer diagram (RTD) display produced by the process of FIG. 1.

An example of an RTD display 16 is shown in FIG. 2. The RTD display is the primary graphical display for viewing top-level design information. RTD display 16 includes a block diagram of various circuit elements that comprise a logic design. The circuit elements may be computer chips having complex functionality, such as a programmable logic, or individual elements, such as a multiplexer. The identity and/or functionality of each block may be identified. RTD display 16 also shows the connectivity of the elements and their relative physical placement in the logic design.

The RTD display may be used to generate simulation code (described below) for the logic design (which may be stored in the database), as described in detail below in section 1.0, entitled "CODE ORDERING".

Figure 3:
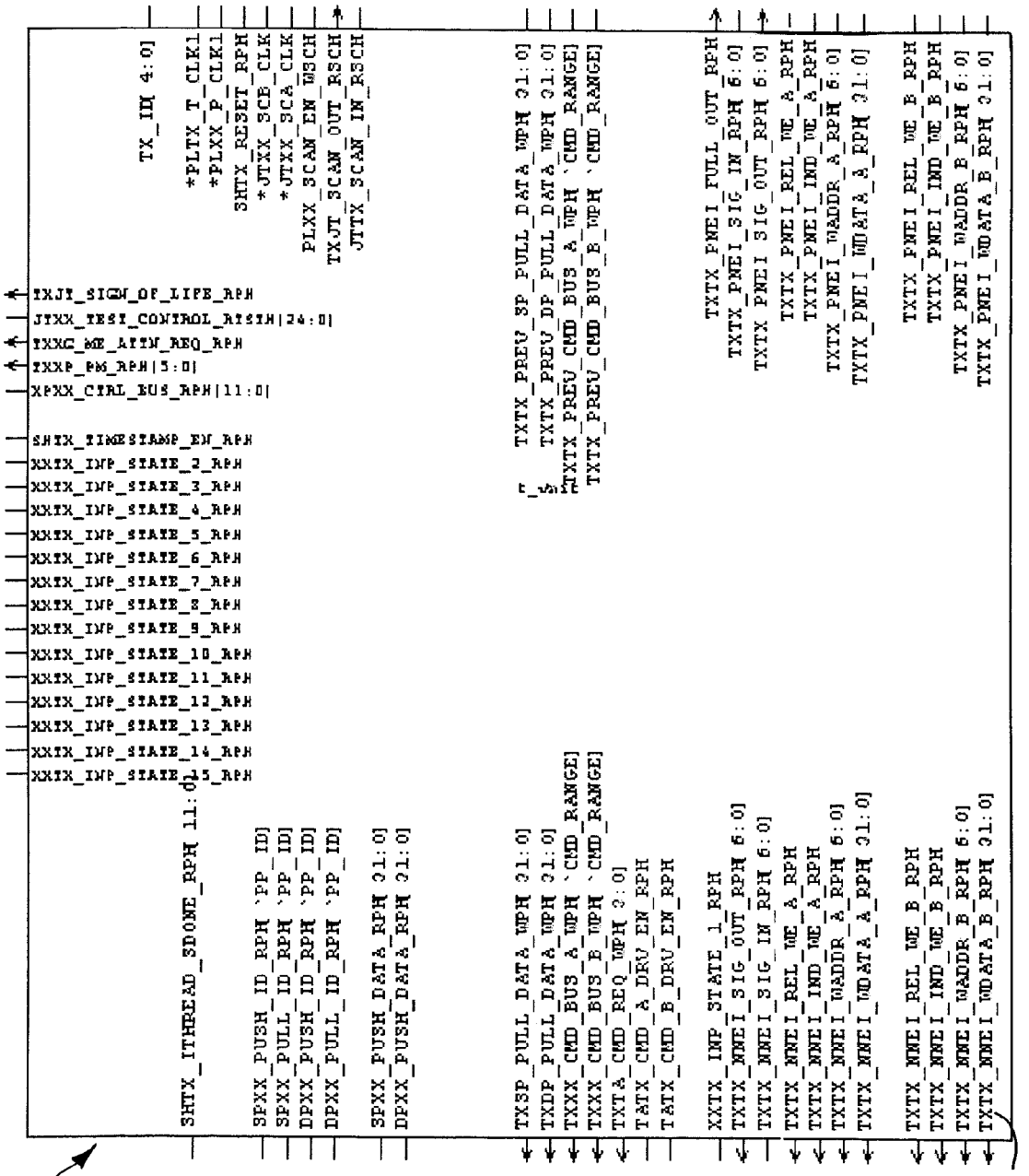
FIG. 3 is a block diagram of an interface display produced by the process of FIG. 1.

An example of an interface display 18 is shown in FIG. 3. Interface display 18 includes text (e.g., 20) describing circuit element pin interfaces associated with one or more blocks selected from a corresponding RTD display. That is, a user may select an element on the RTD display and specify the interface display for the element. In response to the user's input, as described below, the interface display of that element is presented to the user. The text identifies signals passing through pins of a selected RTD element.

Figure 4:
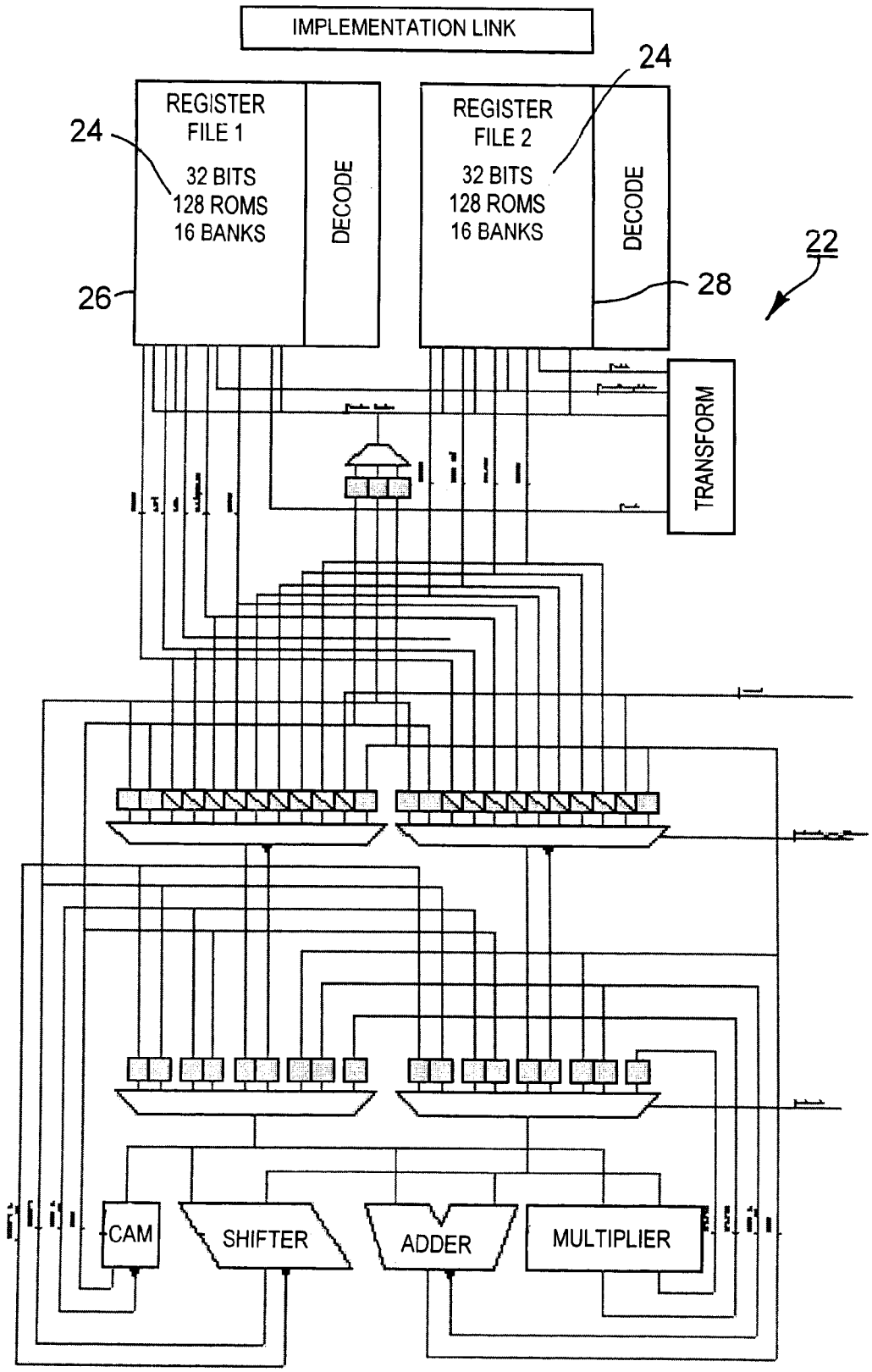
FIG. 4 is a block diagram of a combination box display produced by the process of FIG. 1.

An example of a combination box display 22 is shown in FIG. 4. Combination box display 22 includes a block diagram of the logic design, along with simulation code 24 associated with the blocks. In this regard, computer languages exist which allow designers to simulate logic designs, including combinatorial and state elements, prior to forming the logic on silicon. Examples of such languages include Verilog and Very High-level Design Language (VHDL). Using these languages, a designer can write code to simulate a logic design and execute that code in order to determine if the logic design performs properly. Standard computer languages may also be used to simulate a logic design. One example of a computer language that may be used is C++. See section 1.0 below, entitled "CODE ORDERING". The combination box view may display the simulation code by block (e.g., blocks 26 and 28) or in its own separate window (not shown).

Figure 5:
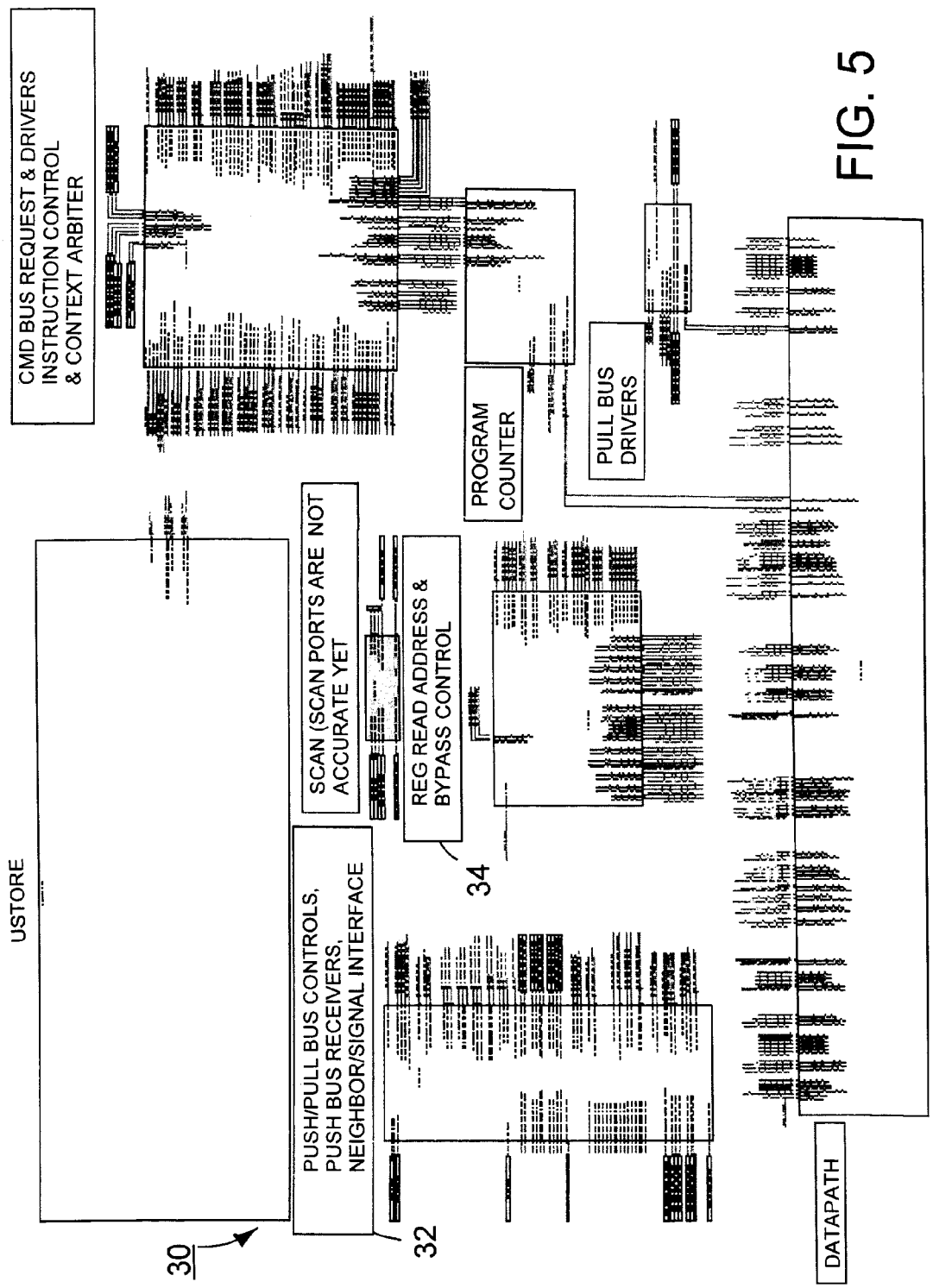
FIG. 5 is a block diagram of a documentation display produced by the process of FIG. 1.

An example of a documentation display 30 is shown in FIG. 5. Documentation display 30 provides a block diagram view of a logic design. The documentation display may contain the same elements as the RTD display or it may be a "higher-level" or "lower-level" view of the elements comprising the logic design. As shown in FIG. 5, the documentation display contains textual descriptions, e.g., 32, 34, of an adjacent block. The textual descriptions may identify the adjacent block by name and/or function and may contain debug information, if that is available from the database. Other information may be provided as well.

The different displays in the database are integrated (e.g., associated with, or indexed to, one another) for a single logic design. Pointers or look-up tables (LUTs) may be stored in the database to make the necessary associations. Graphical "hot links" may be embedded in the displayed graphical elements in order to retrieve associated displays quickly. Hypertext Mark-up Language (HTML) may be used to implement the hot links; although the invention is not limited to using HTML. In operation, using a mouse to click on a graphic element, such as element 36 in RTD display 16 (FIG. 2), links the user to a predetermined other type of display, such as the interface display of FIG. 3. The hot link acts as a pointer to desired display information in the database, retrieves that information automatically, and displays the information to the user.

Alternatively, the user may be provided with graphical menus, e.g., by clicking on a graphical element. That is, clicking on a graphical element, such as graphical element 36 in RTD display 16, causes a menu (not shown) to be displayed to the user. The menu contains a list of the various display types (i.e., RTD, interface, combination box, and documentation). The user may then select the type of display for the current logic design. In response to the user selection, the appropriate data is retrieved and displayed.

Referring back to FIG. 1, once a database having the foregoing characteristics has been stored, run-time stage 14 may be executed. It is noted that the run-time stage 14 may be executed any number of times without re-executing pre-processing stage 12.

During run-time stage 14, process 10 generates (102) a first type of display, such as RTD display 16. Any one of the different types of displays (RTD, interface, combination box, or documentation) may be generated at this point. However, since the RTD display is the primary graphical view, it is used in this example. Process 10 receives (103) a user input. As noted above, the user input may constitute a user selecting a graphical element on the display (or it may be, e.g., a right-click anywhere on the display).

Assume, for illustration's sake, that the user selects a graphical element. In response, process 10 displays (104) a menu containing a list of the different types of displays (i.e., RTD, interface, combination box, and documentation). The user selects one of the types of displays from the list, which may be one of the types not already in use (in this example, RTD). Process 10 receives (105) the user's input and generates (106) a new display in response to that input. That is, process 10 retrieves information corresponding to the selected display type for the currently-displayed logic design and displays that information to the user. For example, if the RTD display is currently being displayed and the user selects to view the interface display for a block on the RTD display, process 10 retrieves the interface display information from the database for the selected block and presents it to the user. If a hot link is present in the selected block, the menu is bypassed and the information identified by the hot link is retrieved from the database and displayed automatically.

The run-time stage of process 10 may be repeated as many times as desired to change the current display type. A menu option from a tool bar (not shown) may be provided which allows the user to select a new logic design.

1.0 Code Ordering

Figure 6:
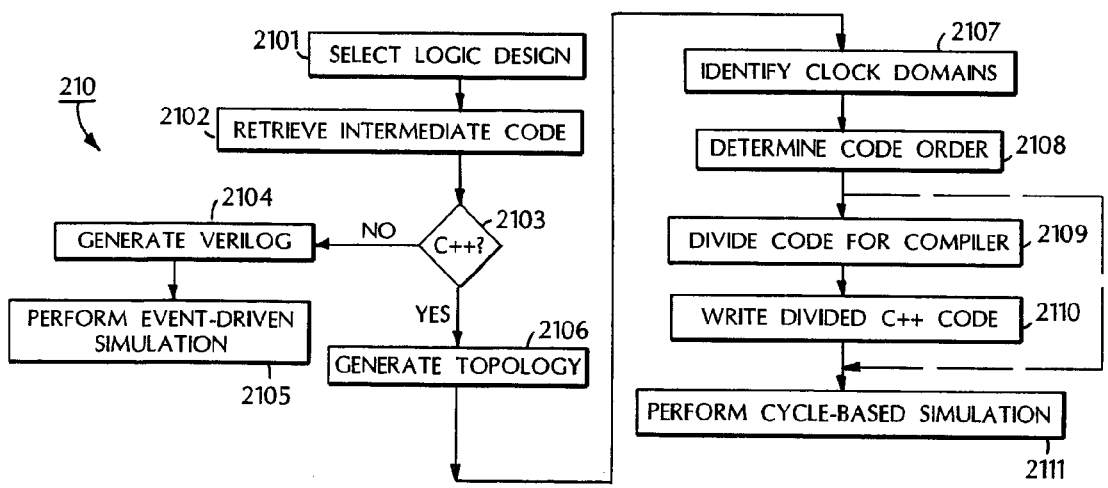
FIG. 6 is a flowchart showing a process for generating simulation code for a logic design.

Referring to FIG. 6, a process 210 is shown for simulating a logic design comprised of combinatorial logic and state logic. Process 210 may be implemented using a computer program running on a computer or other type of machine, as described in more detail below.

In operation, process 210 selects (2101), in response to a logic designer's input, a predetermined logic design from the database created in process 10. Alternatively, the user may build a new logic design.

Figure 7:
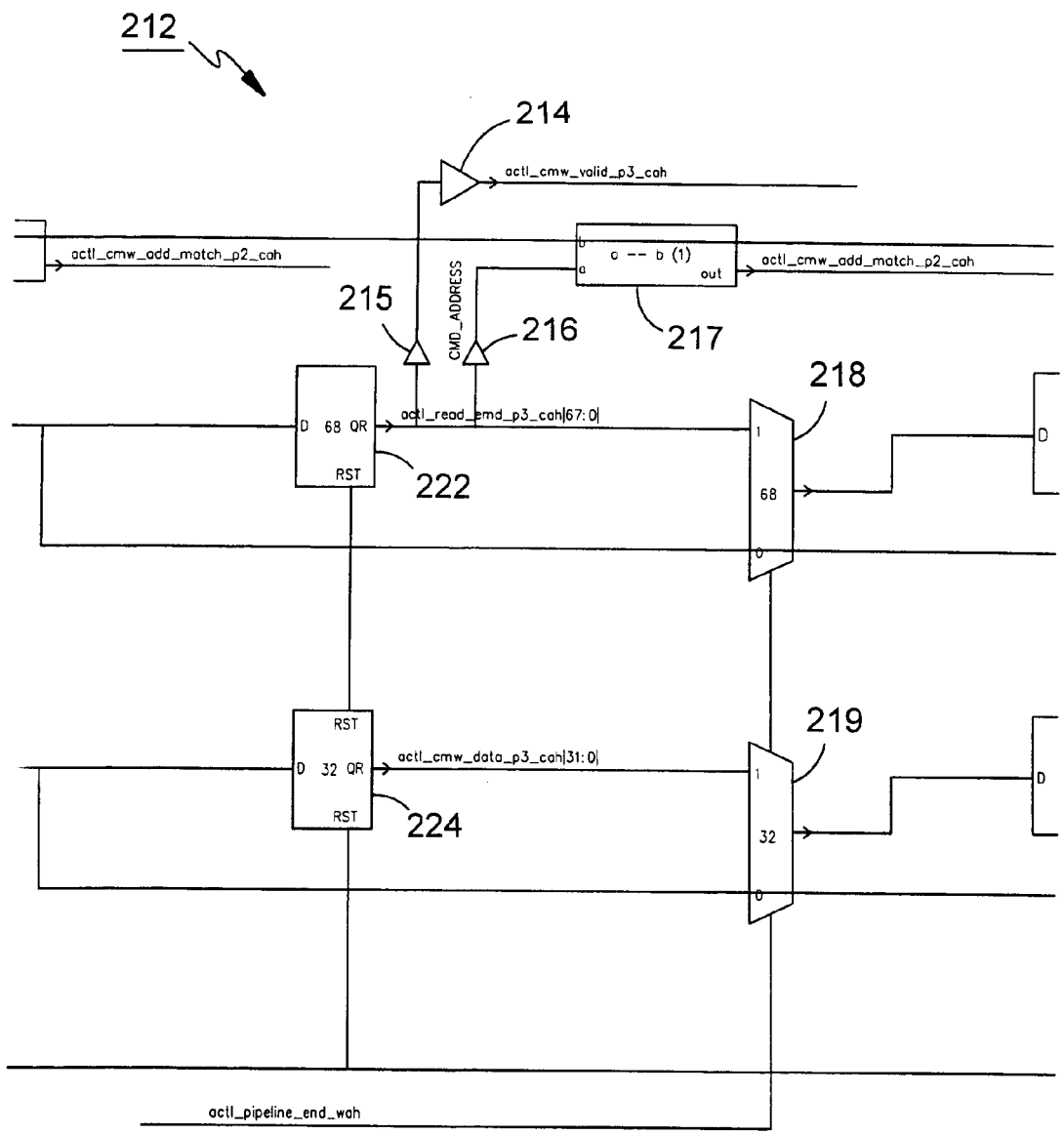
FIG. 7 is a block diagram of a logic design containing individual state and combinatorial elements.
Figure 8:
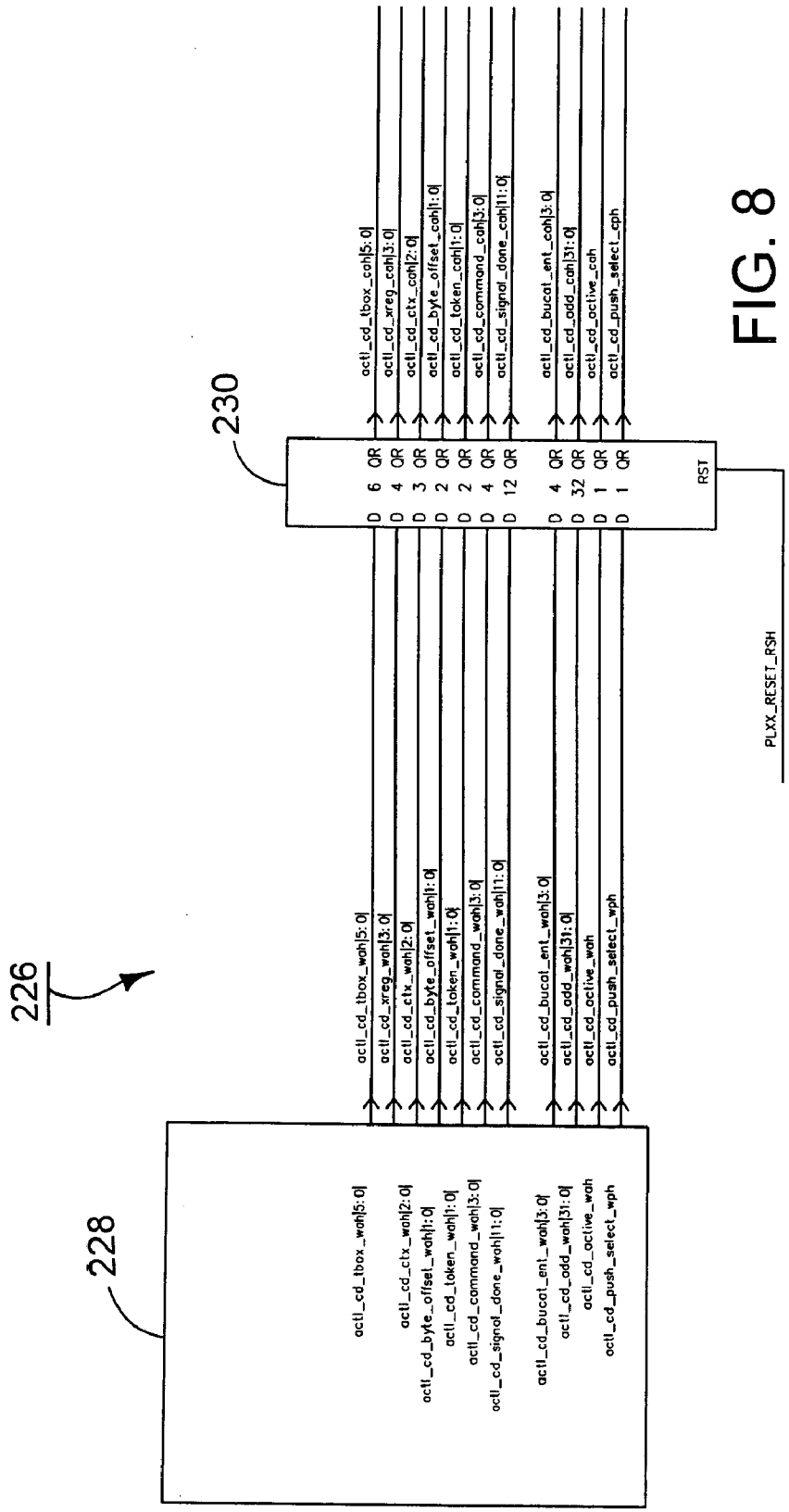
FIG. 8 is a block diagram of an alternative logic design containing state and combinatorial elements.

Each block in the selected logic design may represent individual elements or combinations of elements. For example, FIG. 7 shows a graphical representation of a logic design 212 containing combinatorial logic elements 214 to 219 and state logic elements 222 and 224. In logic design 212, each block represents a single combinatorial element (e.g., multiplexers 218 and 219) or state element (e.g., FFs 222 and 224). In logic design 226 (FIG. 8), the functionality of several combinatorial elements is contained in a single combinatorial block 228 and the function of several state elements is contained in a single state block 230.

Once the logic design has been selected, process 210 retrieves (2102) intermediate computer code that is associated with the logic design from the database. The computer code is "intermediate" in the sense that it is an application-specific code, from which simulation code, such as C++ or Verilog, may be generated. In one embodiment, the intermediate computer code includes a netlist that defines logic elements and the interconnections of those elements.

The intermediate code has been entered by the designer for each graphic element. For example, the designer may select a graphic element and, using an interactive tool, enter computer code to define the combinatorial (or state) logic represented by that element. The designer may use software objects from a graphics library, such as FFs, latches, AND gates, etc., in the intermediate code. Several objects may be combined within a single graphic element by writing intermediate computer code to effect the combination. For example, an array of FFs may be produced by combining objects from the library via the intermediate code. Graphic element 230 (FIG. 8) contains such an array of FFs.

When designing the logic, the logic designer is constrained to represent combinatorial logic and state logic using separate graphic elements. Representing the design using separate state logic and combinatorial logic elements ensures that each separate logic element will achieve its desired state with one iteration, making cycle-based simulation (defined below) possible.

Assuming that there are no problems with the design, or that the problems have been corrected, process 210 generates simulation code for the design. In this embodiment, process 10 generates either Verilog computer code or C++ computer code from the intermediate computer code. However, the simulation code is not limited to generating only these two types of simulation code. Any other type of suitable code, an example of which is VHDL, may be generated.

Generally speaking, the designer may select, e.g., via a graphical user interface (GUI) (not shown), which computer code (C++ or Verilog) process 210 will generate. The type of simulation desired may dictate the computer code that process 210 will generate, as described below.

In more detail, two types of logic simulations include cycle-based simulations and event-driven simulations. An event-driven simulation converges on an output of the logic design through multiple cycles. Convergence requires several passes through "logic cones" defined by the computer code.

Figure 9:
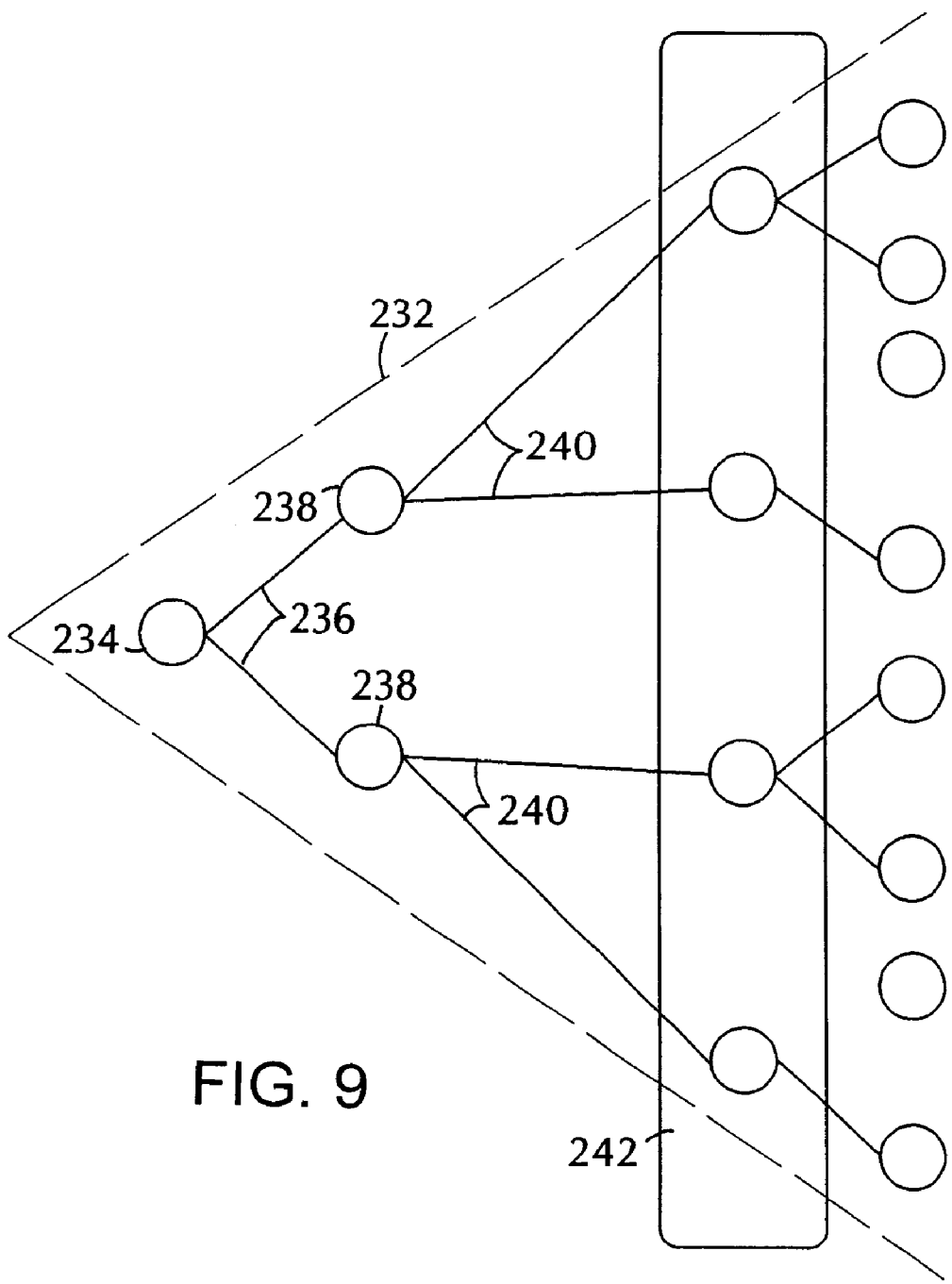
FIG. 9 shows a logic cone.

Referring to FIG. 9, a logic cone 232 is an ordered arrangement in which one logic element 234 passes its output 236 to multiple logic elements 238, which, in turn, pass their outputs 240 to other logic elements 242, and so on. Combining state and combinatorial logic elements within a single logic cone requires multiple passes (iterations) through that cone in order for the state elements to achieve the appropriate states and thus provide the proper output.

The syntax of some simulation languages, such as Verilog, is particularly amenable to event-driven simulations, since they interleave state and combinatorial logic By contrast, C++ can be used to effect cycle-based simulations. Cycle-based simulations assume that the computer code is ordered correctly, meaning that each logic cone can be traced, with only one iteration, to provide an output. Thus, cycle-based simulations require only a single pass through a logic cone in order to determine its output.

As a result, cycle-based simulators are faster, e.g., an order of magnitude faster, than event-driven simulators (since cycle-based simulators require only one pass, versus multiple passes, through a logic cone). So, for example, on a platform, such as an Intel® Pentium® III microprocessor running at 700 MHz (megahertz), simulating 100 cycles of a complex logic design with an event-driven model might take 10 seconds, whereas performing the same simulation using a cycle-based simulator might take 1 second.

For the foregoing reasons, cycle-based simulations are generally preferred over event-driven simulations. Since separating the combinatorial logic from the state logic facilitates cycle-based simulations, process 210 provides a significant advantage to logic designers.

Referring back to FIG. 6, process 210 decides (2103) whether to generate C++ simulation code or Verilog simulation code from the intermediate computer code. This decision (2103) is typically made based on an input from the logic designer. If process 210 decides (2103) that Verilog code is to be generated, process 210 generates (2104) the Verilog code from the intermediate code. The Verilog code may be generated from the intermediate code using a translator program (not shown) and a database (not shown) that correlates the connections defined by the intermediate code to Verilog code. Parameters or values in the intermediate code are identified and input to the Verilog code.

After process 210 generates (2104) the Verilog code, process 210 runs (2105) the Verilog code through an event-driven simulator program (or stores it in the database). The event-driven simulator program runs, and provides inputs (e.g., clock signals), to the Verilog code to generate a simulation of the operation of the logic design. To obtain an output of the logic design using the event-driven simulation, more than one pass through each logic cone defined by the Verilog code may be required.

If process 210 decides (2103) to generate C++ code from the intermediate code (based, e.g., on an input from the logic designer), process 210 generates (2106) a topology of each graphic element of the logic design based on the intermediate code. In more detail, process 210 traces the logic gates through the intermediate code for each graphic element in order to determine how the logic gates are connected to one another. Essentially, process 210 obtains a gate topology from the intermediate code.

Process 210 identifies (2107) clock domains in the topology. In this context, a clock domain comprises a set of logic elements (gates) that are triggered in response to the same clock pulse. For example, referring to FIG. 10, logic gates 250 to 260 are all triggered in response to clock pulse 262, which is initially applied to logic gates 250, 251. The intermediate code provided by the designer indicates which clock pulses trigger which logic gates. Accordingly, process 210 traces clock pulses through the logic gates in order to identify the clock domains.

Once the clock domains are identified, process 210 determines (2108) the order in which the logic gates are to be simulated. This is referred to as "code ordering", since the order in which the gates are simulated dictates the order of the resulting C++ code. Process 210 performs code ordering by tracing through each clock domain separately and assigning numerical values to the logic gates.

Figure 10:
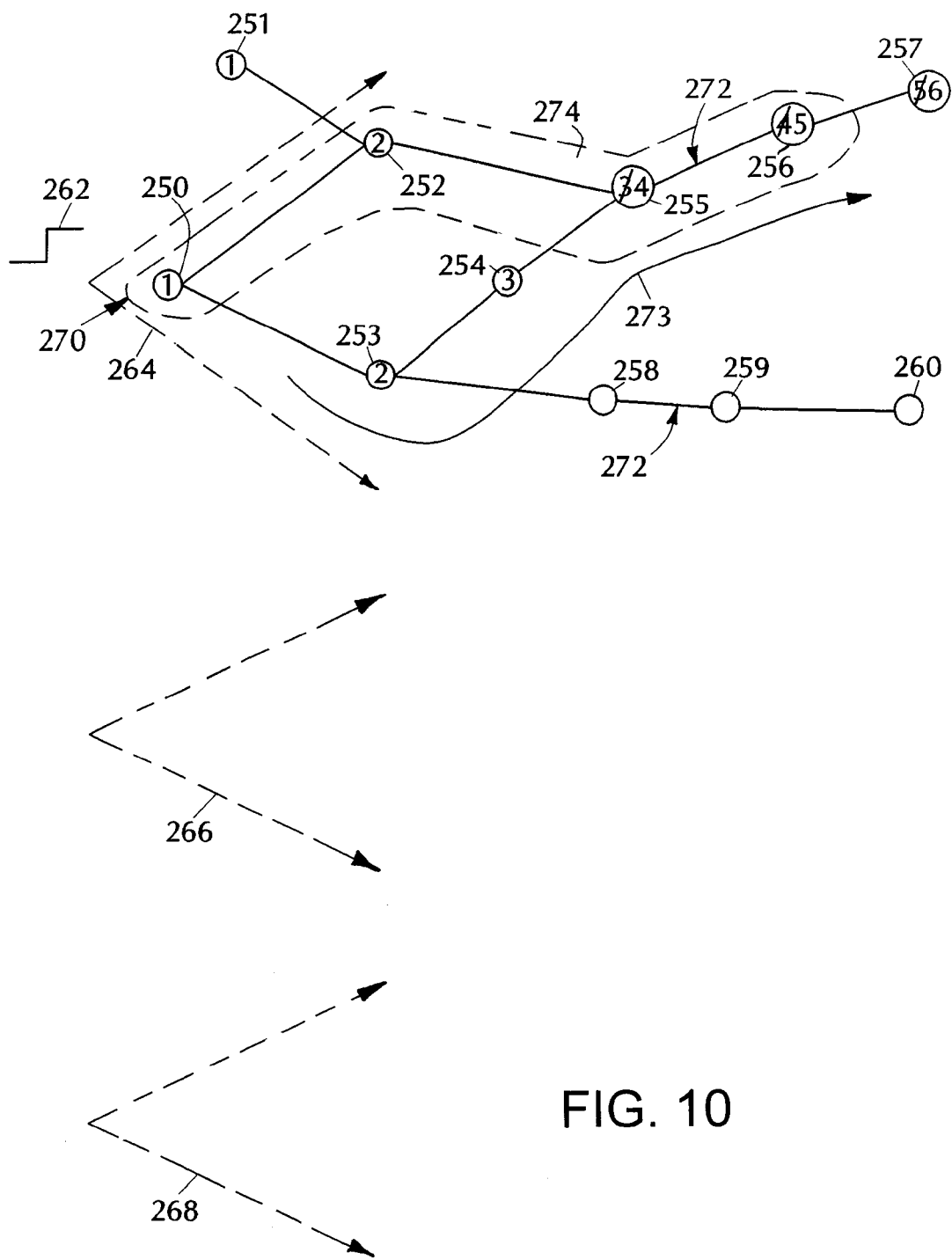
FIG. 10 shows clock domains of a logic design.

Referring to FIG. 10, each clock domain 264, 266, 268 can be thought of as a tree having a trunk 270 and branches 272. Process 210 starts at the trunk, in this case logic gate 272, and traverses the tree through to the end of each branch. So, process 210 numbers the trunk (gate 250) "1", then, for branch 274, numbers gate 252 "2", gate 255 "3", gate 256 "4", and so forth. To number another branch, process 210 starts at the trunk and then proceeds in the foregoing manner.

Occasional renumbering may be required, resulting in branches whose gates are not sequentially numbered. This does not present a problem, so long as the assigned number of a child branch is higher than the assigned number of a parent branch. By way of example, assume that there are two starting points (trunks) for clock domain 264. These two starting points are gates 250 and 251. Since both are starting points, they are both assigned number "1". Further assume that branch 272 is first traced starting with gate 251, resulting in gate 251 being assigned a "1", gate 252 being assigned a "2", gate 255 being assigned a "3", and so forth. When branch 272 is retraced starting at gate 250 through path 273, gate 255 is renumbered "4", gate 256 is renumbered "5", and so forth. This may occur as often as necessary in order to ensure that each branch is numbered correctly.

Following the numbering, process 210 examines each clock domain and extracts, from each clock domain, the logic gates numbered "1". These gates are stored in an area of a database. Once this is done, process 210 examines each clock domain and extracts, from each domain, the logic gates numbered "2". These gates are stored in another area of the database. This is repeated then, for each set of logic gates numbered "3", "4", etc., until sets of all numbered logic gates are stored in different areas of the database. Using this database, process 210 generates simulation code (in this embodiment, C++ code) for the logic gates.

In more detail, for the set of logic gates assigned number "1", process 210 generates C++ code. That is, process 210 defines the connections of the "1" gates, their states, clocks, and other dependencies in C++ code. Following the C++ code for the set of logic gates assigned number "1", process 210 generates C++ code to simulate the set of logic gates assigned number "2". Following the C++ code for the set of logic gates assigned number "2", process 210 generates C++ code to simulate the set of logic gates assigned number "3". This is repeated in sequence until C++ code is generated for all sets of logic gates (e.g., "4", "5", etc.) in the database.

The C++ simulation code may be generated from the intermediate code using a translation program (not shown) and referencing a database (not shown) that correlates the connections and functions specified in the intermediate code to C++ code. Any parameters or values included in the intermediate code are identified and applied to the C++ code.

After process 210 generates the C++ code, process 210 may run (2111) the C++ code through a cycle-based simulator program (this path is indicated by the dotted line in FIG. 6). The cycle-based simulator program provides inputs to, and runs, the C++ code to provide a simulation of the operation of the logic design. To obtain an output of the logic design using the cycle-based simulation, one pass through each logic gate defined by the C++ code is made.

In some instances, a C++ compiler may be unable to compile the C++ code due to its size (i.e., the generated C++ code may be too long for a standard C++ compiler). In these instances, further processing may be required. This processing includes dividing (2109) the C++ code into segments based on the numbered logic gates; writing (2110) the divided C++ code into separate C++ files and batch files, and compiling the separate C++ files. Thus, in order to use a standard compiler, process 210 compiles C++ code for each set of numbered logic gates. The compiled C++ code may then be run through the cycle-based simulator program separately.

The states of each logic gate are stored in a database as well. Process 210 takes advantage of C++ inheritance capabilities to enable the C++ compiler to handle the large numbers of states that may result from a given logic model. That is, the state of an initial logic gate may be defined as a C++ class. The states of logic gates that depend from the initial logic gate may refer back to the state of the initial logic gate without actually including data for the state of the initial logic gate. This way, if the state of a subsequent gate depends on the state of a preceding gate, it is possible to obtain the state of the preceding gate without actually adding more data to the database.

Keeping the combinatorial logic and state logic separate according to process 210 makes it possible to identify clock domains and, thus, to perform cycle-based simulations. The advantages of cycle-based simulations are noted above.

Figure 11:
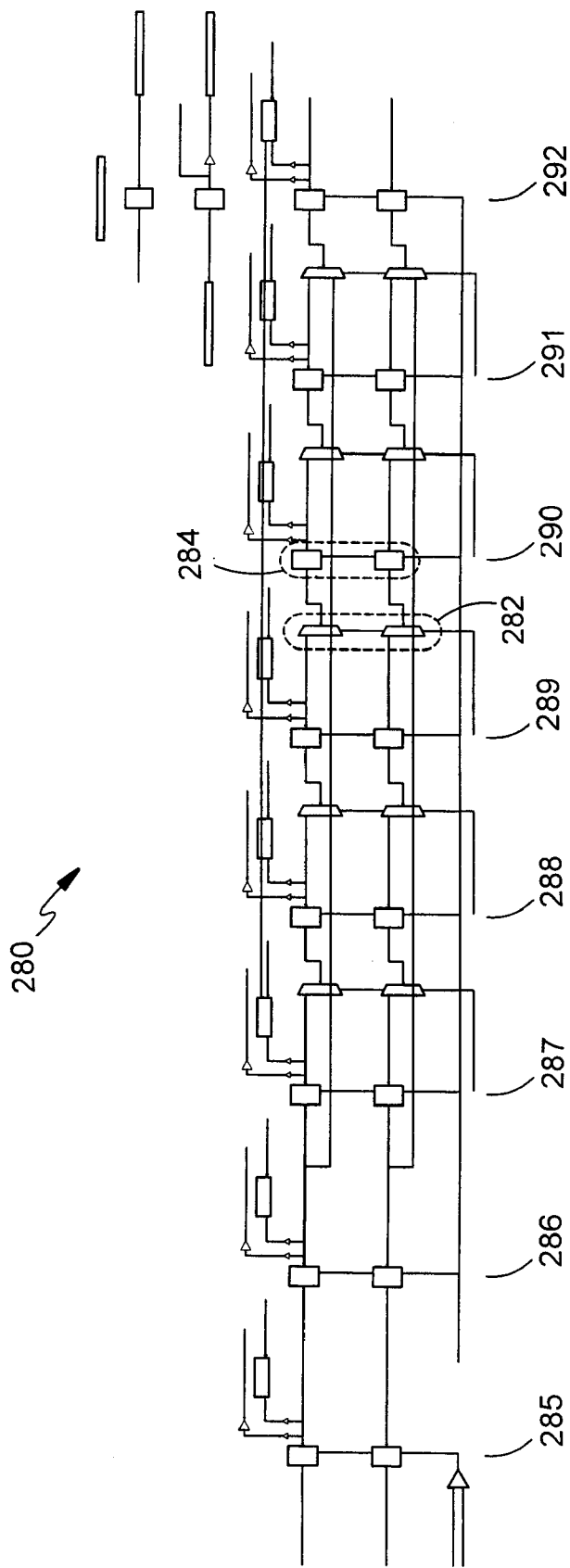
FIG. 11 is a block diagram of an alternative logic design containing state and combinatorial elements.

Another advantage to keeping combinatorial and state logic separate is that it facilitates manual review of logic designs. Representing the different logic types (e.g., state and combinatorial) in different colors further facilitates the manual review. For example, FIG. 11 shows a logic design 280 that contains both combinatorial logic elements (e.g., 282) and state logic elements (e.g., 284). Simply by looking at logic design 280, it is possible to obtain relevant design information, such as the number of pipeline stages in the design (in this case, there are eight such stages 285 to 292). Other relevant information may also be obtained.

Additionally, by explicitly calling-out state logic elements while in the design environment, it is relatively easy to develop heuristic tools for providing time/size guidance for a given set of design parameters, such as operating frequency and/or chip area.

2.0 Architecture

Figure 12:
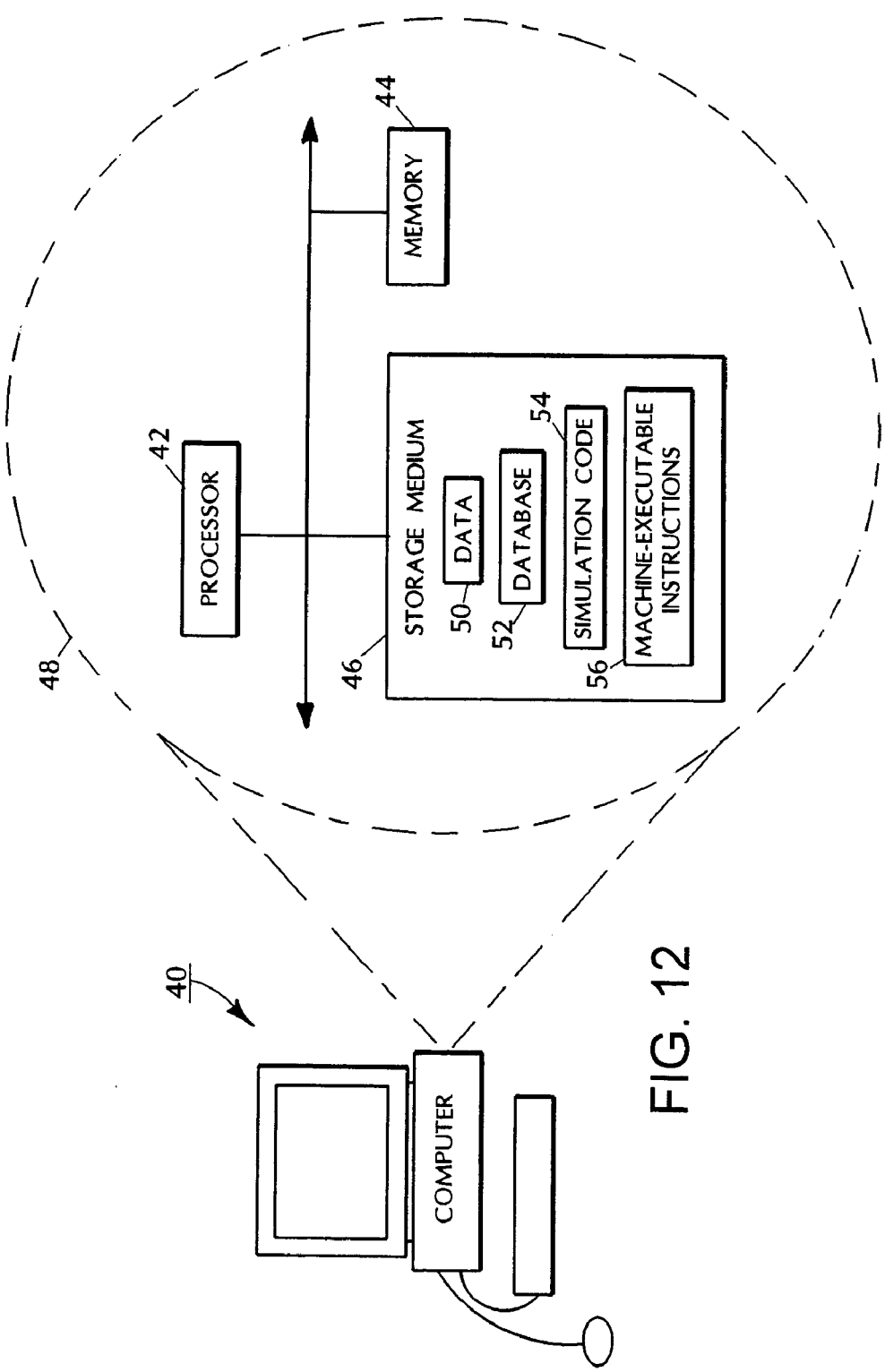
FIG. 12 is a block diagram of a computer system on which the processes of FIGS. 1 and 6 may be executed.

FIG. 12 shows a computer 40 on which processes 10 and 210 may be performed. Computer 40 includes a processor 42, a memory 44, and a storage medium 46 (e.g., a hard disk) (see view 48). Storage medium 46 stores data 50 that defines a logic design, a database 52 that includes the integrated logic design information, simulation code 54 (e.g., C++ code or Verilog code), and machine-executable instructions 56, which are executed by processor 42 out of memory 44 to perform processes 10 and 210.

Processes 10 and 210, however, are not limited to use with the hardware and software of FIG. 12; they may find applicability in any computing or processing environment. Processes 10 and 210 may be implemented in hardware, software, or a combination of the two. Processes 10 and 210 may be implemented in computer programs executing on programmable computers or other machines that each includes a processor, a storage medium readable by the processor (including volatile and non-volatile memory and/or storage elements), at least one input device, and one or more output devices. Program code may be applied to data entered using an input device, such as a mouse or a keyboard, to perform processes 10 and 210.

Each such program may be implemented in a high level procedural or object-oriented programming language to communicate with a computer system. However, the programs can be implemented in assembly or machine language. The language may be a compiled or an interpreted language.

Each computer program may be stored on an article of manufacture, such as a storage medium or device (e.g., CD-ROM, hard disk, or magnetic diskette), that is readable by a general or special purpose programmable machine for configuring and operating the machine when the storage medium or device is read by the machine to perform processes 10 and 210. Processes 10 and 210 may also be implemented as a machine-readable storage medium, configured with a computer program, where, upon execution, instructions in the program cause the machine to operate in accordance with processes 10 and 210.

The invention is not limited to the specific embodiments set forth above. For example, process 10 is not limited to the types and content of displays described herein. Other displays and display contents may be used. Processes 10 and 210 are not limited use with the simulation languages noted above, e.g., Verilog, VHDL, and C++. Processes 10 and 210 also are not limited to the orders set forth in FIGS. 1 and 6. That is, the blocks of processes 10 and 210 may be executed in a different order than that shown to produce an acceptable result.

Other embodiments not described herein are also within the scope of the following claims.

What is claimed is:

1. A method of displaying information relating to a logic design, the method comprising:
   generating a first display that relates to the logic design, the first display being associated with other information not included in the first display, the first display segregating combinatorial elements and state elements;
   retrieving the other information in response to a user input;
   generating a second display that relates to the logic design based on the other information; and
   performing a cycle-based simulation of the logic design based on the first display.

2. The method of claim 1, wherein one of the first and second displays includes a relative physical placement of elements of the logic design.

3. The method of claim 1, wherein one of the first and second displays includes simulation code that simulates at least a portion of the logic design.

4. The method of claim 1, wherein one of the first and second displays includes interface information relating elements of the logic design.

5. The method of claim 4, wherein the interface information comprises circuit element pin assignments.

6. The method of claim 1, wherein one of the first and second displays includes text that corresponds to functions of elements of the logic design.

7. The method of claim 6, wherein the text explains functions of the elements of the logic design.

8. The method of claim 1, further comprising:
   storing data in a database that associates the first display to the second display;
   wherein the data is used in retrieving the other information.

9. The method of claim 1, further comprising:
   displaying a menu providing options that correspond to the user input, the menu specifying a type of the second display.

10. The method of claim 1, further comprising:
  selecting an element of the logic design from the first display;
  wherein generating the second display further comprises providing information relating to the selected element.

11. An article comprising a machine-readable medium which stores executable instructions to display information relating to a logic design, the instructions, when executed, causing a machine to:
  generate a first display that relates to the logic design, the first display being associated with other information not included in the first display, the first display segregating combinatorial elements and state elements;
  retrieve the other information in response to a user input;
  generate a second display that relates to the logic design based on the other in formation; and
  perform a cycle-based simulation of the logic design based on the first display.

12. The article of claim 11, wherein one of the first and second displays includes a relative physical placement of elements of the logic design.

13. The article of claim 11, wherein one of the first and second displays includes simulation code that simulates at least a portion of the logic design.

14. The article of claim 11, wherein one of the first and second displays includes interface information relating elements of the logic design.

15. The article of claim 14, wherein the interface information comprises circuit element pin assignments.

16. The article of claim 11, wherein one of the first and second displays includes text that corresponds to functions of elements of the logic design.

17. The article of claim 16, wherein the text explains functions of the elements of the logic design.

18. The article of claim 11, further comprising instructions that cause the machine to:
  store data in a database that associates the first display to the second display;
  wherein the data is used in retrieving the other information.

19. The article of claim 11, further comprising instructions that cause the machine to:
  display a menu providing options that correspond to the user input, the menu specifying a type of the second display.

20. The article of claim 11, further comprising instructions that cause the machine to:
  select an element of the logic design from the first display;
  wherein to generate the second display comprises providing information relating to the selected element.

21. An apparatus for displaying information relating to a logic design, the apparatus comprising:
  a memory which stores executable instructions; and
  a processor which executes the instructions to:
    generate a first display that relates to the logic design, the first display being associated with other information not included in the first display, the first display segregating combinatorial elements and state elements;
    retrieve the other information in response to a user input; and
    generate a second display that relates to the logic design based on the other information;
    perform a cycle-based simulation of the logic design based on the first display.

22. The apparatus of claim 21, wherein one of the first and second displays includes a relative physical placement of elements of the logic design.

23. The apparatus of claim 21, wherein one of the first and second displays includes simulation code that simulates at least a portion of the logic design.

24. The apparatus of claim 21, wherein one of the first and second displays includes interface information relating elements of the logic design.

25. The apparatus of claim 24, wherein the interface information comprises circuit element pin assignments.

26. The apparatus of claim 25, wherein one of the first and second displays includes text that corresponds to functions of elements of the logic design.

27. The apparatus of claim 26, wherein the text explains functions of the elements of the logic design.

28. The apparatus of claim 21, wherein:
  the processor executes additional instructions to store data in a database that associates the first display to the second display; and
  the data is used in retrieving the other information.

29. The apparatus of claim 21, wherein the processor executes additional instructions to display a menu providing options that correspond to the user input, the menu specifying a type of the second display.

30. The apparatus of claim 21, wherein:
  the processor executes additional instructions to display an element of the logic design from the first display; and
  generating the second display comprises providing information relating to the selected element.

* * * * *